United States Patent
Kaneko

(10) Patent No.: US 8,350,297 B2
(45) Date of Patent: Jan. 8, 2013

(54) COMPOUND SEMICONDUCTOR DEVICE AND PRODUCTION METHOD THEREOF

(75) Inventor: Nobuo Kaneko, Niiza (JP)

(73) Assignee: Sanken Electric Co., Ltd, Niiza-shi (JP)

( * ) Notice: Subject to any disclaimer, the term of this patent is extended or adjusted under 35 U.S.C. 154(b) by 234 days.

(21) Appl. No.: 12/962,118

(22) Filed: Dec. 7, 2010

(65) Prior Publication Data

US 2011/0140174 A1      Jun. 16, 2011

(30) Foreign Application Priority Data

Dec. 10, 2009    (JP) ................................ 2009-280880

(51) Int. Cl.
*H01L 29/778* (2006.01)
*H01L 21/335* (2006.01)

(52) U.S. Cl. ......... 257/194; 257/E21.403; 257/E29.246; 438/172

(58) Field of Classification Search .................. 438/172
See application file for complete search history.

(56) References Cited

U.S. PATENT DOCUMENTS

| 7,898,004 | B2 * | 3/2011 | Wu et al. ........................ 257/194 |
| 2007/0102727 | A1 * | 5/2007 | Twynam ........................ 257/194 |
| 2007/0200143 | A1 * | 8/2007 | Saito et al. ..................... 257/192 |
| 2010/0019279 | A1 * | 1/2010 | Chen et al. ..................... 257/194 |

FOREIGN PATENT DOCUMENTS

| JP | 2006-5005 | 1/2006 |
| JP | 2009-60049 | 3/2009 |

* cited by examiner

*Primary Examiner* — Stephen W Smoot

(74) *Attorney, Agent, or Firm* — Oblon, Spivak, McClelland, Maier & Neustadt, L.L.P.

(57) ABSTRACT

A compound semiconductor device is comprised of: a compound semiconductor layer including a first active layer and a second active layer forming a hetero junction with the first active layer so as to naturally generate a two-dimensional carrier gas channel in the first active layer along the hetero junction; a first electrode formed on the second active layer; a second electrode in ohmic contact with the first active layer and isolated from the first electrode; and a channel modifier for locally changing a part of the first active layer under the channel modifier into a normally-off state, the channel modifier being formed on the second active layer so as to enclose but be isolated from the first electrode and the second electrode.

9 Claims, 9 Drawing Sheets

COMPOUND SEMICONDUCTOR DEVICE AND PRODUCTION METHOD THEREOF

CROSS-REFERENCE TO RELATED APPLICATIONS

This application is based upon and claims the benefit of priority from the prior Japanese Patent Application No. 2009-280880 (filed Dec. 10, 2009); the entire contents of which are incorporated herein by reference.

BACKGROUND OF THE INVENTION

1. Field of the Invention

The present invention relates to a compound semiconductor device with a two-dimensional carrier gas channel and a production method thereof.

2. Description of the Related Art

A transistor having a hetero junction of compound semiconductors so as to generate a two-dimensional electron gas is known as "high-electron-mobility transistor", or its shortened form "HEMT".

Typically a hetero junction in a HEMT is comprised of an AlGaAs layer and a non-doped GaAs layer. Because AlGaAs has a wider band gap than GaAs, a quantum well is formed in the GaAs layer along the hetero junction. Abundant electrons supplied by the AlGaAs layer to the quantum well forms a two-dimensional electron gas and can quickly move therethrough because the non-doped GaAs layer is free from impurities which cause collision with the electrons. The quantum well thus formed is referred to as "two-dimensional electron gas (2DEG) channel".

Because of such high electron mobility, HEMTs are widely used for producing high-speed switching devices and high-frequency devices. Recently an AlGaN/GaN system is under intense study because an AlGaN layer on a GaN layer generates a relatively dense 2 DEG even if the AlGaN layer is un-doped. HEMTs of the AlGaN/GaN system are considered to be promising in view of efficiency and operation speed.

Japanese Patent Unexamined Publications No. 2006-5005 and 2009-060049 disclose related arts.

SUMMARY OF THE INVENTION

The present invention has been achieved to provide a compound semiconductor device with a two-dimensional carrier gas having low leak current and a production method thereof.

According to a first aspect of the present invention, a compound semiconductor device is comprised of: a compound semiconductor layer including a first active layer and a second active layer forming a hetero junction with the first active layer so as to naturally generate a two-dimensional carrier gas channel in the first active layer along the hetero junction; a first electrode formed on the second active layer; a second electrode in ohmic contact with the first active layer and isolated from the first electrode; and a channel modifier for locally changing a part of the first active layer under the channel modifier into a normally-off state, the channel modifier being formed on the second active layer so as to enclose but be isolated from the first electrode and the second electrode.

According to a second aspect of the present invention, a method of production of a compound semiconductor device comprised of forming a first active layer of a first compound semiconductor; forming a hetero junction by layering a second active layer on the first active layer so as to naturally generate a two-dimensional carrier gas channel in the first active layer along the hetero junction; forming a second electrode on the first active layer so as to have an ohmic contact with the first active layer and isolate the second electrode from the first electrode; and forming a first electrode and a channel modifier for locally changing a part of the first active layer under the channel modifier into a normally-off state on the second active layer so that the second electrode is isolated from the first electrode and the channel modifier encloses but is isolated from the first electrode and the second electrode.

DETAILED DESCRIPTION OF THE PREFERRED EMBODIMENT

Figure 1:
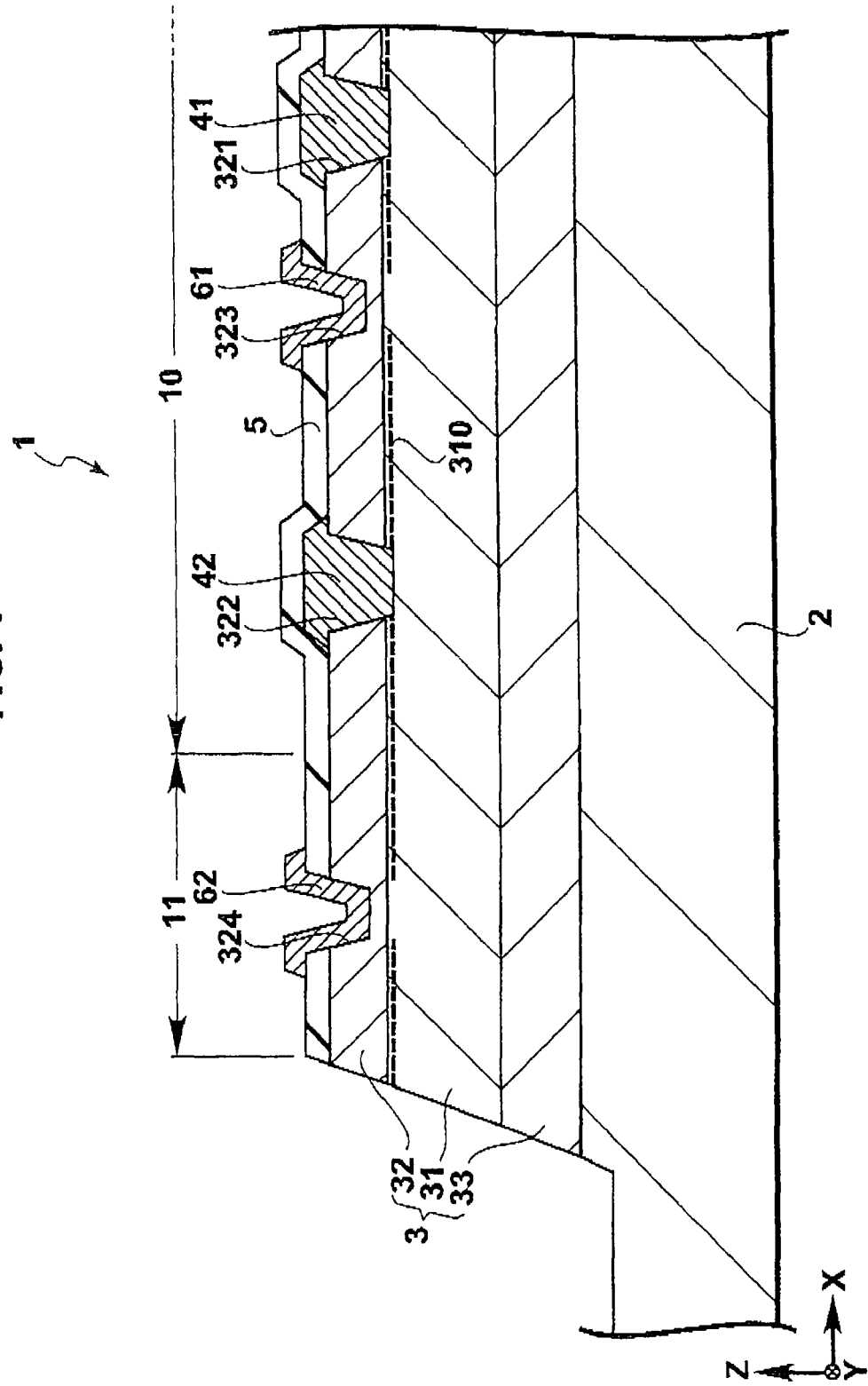
FIG. 1 is a schematic sectional view of a compound semiconductor device according to a first embodiment of the present invention.

Certain embodiments of the present invention will be described hereinafter with reference to the appended drawings.

The following description may sometimes refer X, Y and Z directions in accordance with corresponding arrows shown in the drawings. However, these references to the directions are made only for ease of explanation and are therefore not limiting to the scope of the invention.

(First Embodiment)

Figure 2:
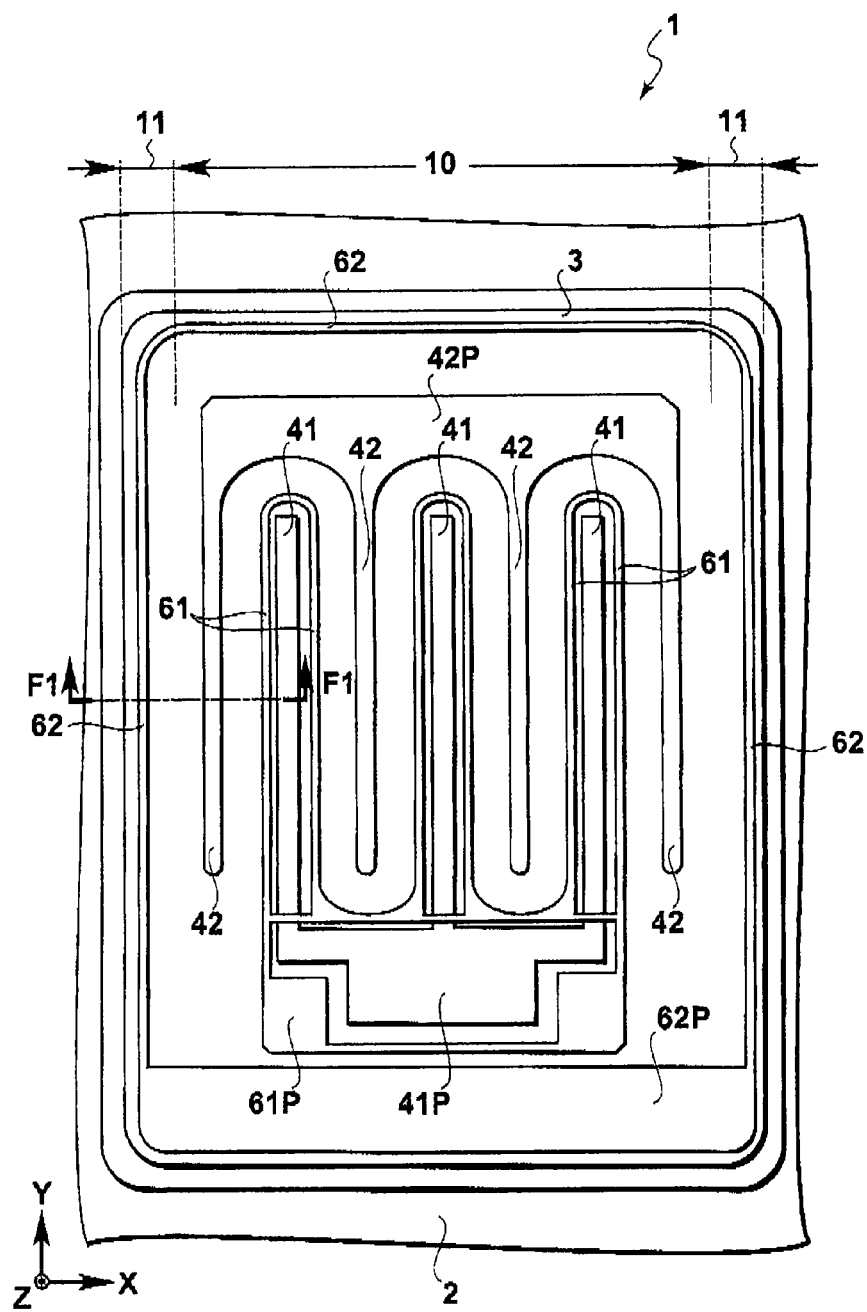
FIG. 2 is a schematic plan view of the compound semiconductor device.
Figure 3:
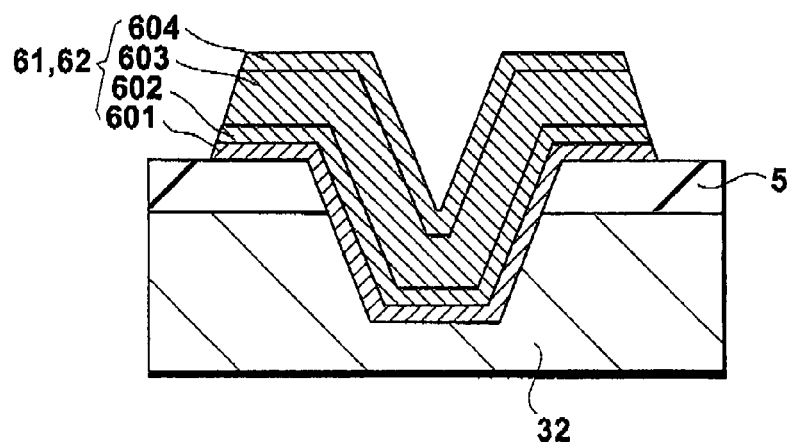
FIG. 3 is a schematic sectional view of a channel modifier or a gate electrode of the compound semiconductor device.

As exemplarily shown in FIGS. 1 through 3, a compound semiconductor device 1 in accordance with a first embodiment of the present invention is formed on a proper substrate 2. The compound semiconductor device 1 is comprised of a compound semiconductor layer 3 including a first active layer 31 and a second active layer 32, which form a hetero junction; a first electrode 61 formed on the second active layer 32; second electrodes 41 and 42 both in contact with the first active layer 31; and a channel modifier 62 formed on the second active layer 32. The electrodes 41, 42 and 61 are formed in a device region 10 and the channel modifier 62 is formed in a peripheral region 11 enclosing the device region 10.

The substrate 2 may be formed of any of sapphire, silicon, silicon carbide, and any proper semiconductors in a form of a single crystal, which allows epitaxial growth of the semiconductor layer 3. Silicon may be preferable in view of availability of single crystals with high quality, large sizes and reasonable costs.

Referring to FIG. 1, directly on the substrate 2, or with an interposed buffer layer 33, formed is the compound semiconductor layer 3 including the hetero junction. The hetero junction may be formed of various combinations of compound semiconductors having different band gaps, such as GaAs with AlGaAs, GaN with AlGaN and so on. The $Al_xIn_yGa_{1-x-y}N$ ($0 \leq x \leq 1$, $0 \leq y \leq 1$, $0 \leq x+y \leq 1$) system semiconductors are attractive due to their high efficiency and high-speed operation. In the $Al_xGa_{1-x}N$ system, a higher x value (Al-richer) results in a wider band gap. Thus control of band gap differentiation can be easily carried out. The following description is directed to an exemplary embodiment of a hetero junction between GaN and AlGaN, but is of course not limiting to the scope of the present invention.

The buffer layer 33 may be interposed between the substrate 2 and the first active layer 31 for the purpose of relaxing lattice mismatch between the substrate 2 and the semiconductor layer 3. The buffer layer 33, if provided, may be formed of a superlattice layer of GaN and AlN if the first active layer 31 is of GaN. A single layer of GaN, a single layer of AlN, or any proper layer may be alternatively applicable.

GaN is exemplarily applied to the first active layer 31, which is usually non-doped so as to obtain high carrier mobility. Thickness of the first active layer 31 may be in a range of 0.5-10 μm, or more particularly 3.0 μm, for example.

AlGaN is preferably applied to the second active layer 32 if the first active layer 31 is of GaN, as AlGaN has a wider band gap than GaN, which is required to form a quantum well, and causes relatively large lattice mismatch, which is advantageous in generating a dense two-dimensional electron gas due to its piezo polarization. In particular $Al_xGa_{1-x}N$ ($0.1 \leq x \leq 0.4$) may be applied thereto. Thickness of the second active layer 32 may be in a range of 5-100 nm, or more particularly 25 nm, for example. The second active layer 32 can be also non-doped in a case of the AlGaN/GaN system but may be moderately doped for the purpose of regulating electric properties.

The hetero junction forms a quantum well in the first active layer 31 along the hetero junction. Further, due to the spontaneous polarization and further the piezo polarization induced by the lattice mismatch, a relatively strong electric field is induced there, thereby generating a two-dimensional carrier (electron, in this case) gas in the first active layer 31 along the hetero junction. This region, to which a reference numeral 310 is attached in FIG. 1, functions as a n-channel where the two-dimensional electron gas is given high mobility. The second active layer 32 functions as a supplier of the carrier gas.

In this exemplary embodiment, the electron gas is used as a carrier, however, hole gas may be instead used if a p-channel can be formed.

The electrodes 41 and 42 are formed to be in ohmic contact with the first active layer 31. The electrode 41 and the electrode 42 are mutually isolated. Preferably, holes 321 and 322 (through-holes or via-holes) are formed so as to penetrate the second active layer 32 and then the electrodes 41 and 42 are filled therein. Further preferably, the holes 311 and 322 are so formed as to slightly sink down into the first active layer 31, thereby having the electrodes 41 and 42 in contact with the two-dimensional carrier gas channel 310.

The electrodes 41 and 42 may be formed in a form of a multilayer. For example, a titanium layer of 10-50 nm in thickness and a gold layer of 25-1000 nm in thickness layered thereon may be applied thereto. The electrodes 41 and 42 may have an identical layer structure. Then the electrodes 41 and 42 can be produced by a common process.

One of the electrodes 41 and 42 may be used as a source and another as a drain of the device 1.

The first electrode 61, which may be used as a gate, is formed on the second active layer 32 and isolated from both the electrodes 41 and 42. Preferably a recess 323 is formed in the second active layer 32 and then the first electrode 61 is laid along the internal surface of the recess 323. The recess 323 preferably recedes in the second active layer 32 toward the first active layer 31 but does not reach the first active layer 31. The depth of the recess 323 into the second active layer 32 may be in a range of 1-24 nm.

FIG. 3 exemplarily illustrates a preferable sectional structure for the first electrode 61, which is also applicable to the channel modifier 62 described later. At the lowermost formed is a semiconductor layer 601 of a conductive type different from that of the two-dimensional carrier gas channel 310. The conductive type is a p-type in this case because the channel 310 has n-type conductivity. Any of metal oxide semiconductors and compound semiconductors doped to be p-type conductivity may be applied to the semiconductor layer 601. As such semiconductors, nickel oxide ($NiO_x$; x is from 0 to 2), iron oxide, cobalt oxide, manganous oxide, cuprous oxide, AlGaN, GaN and InGaN can be exemplified. If nickel oxide is applied, thickness may be exemplarily 20-1000 nm. If GaN doped with magnesium is applied, thickness may be exemplarily 80-120 nm. The layer 601 may be given a gradient of dopant concentration, where the concentration is made gradually smaller toward the upper surface for example. Additionally or alternatively, a multilayer structure is given to the layer 601 and further different materials may be respectively applied to layers included in the multilayer.

While the first electrode 61 may consist only of a single layer, additional layers 602, 603, 604 . . . may be applicable in view of better electric properties. The second layer 602 may be formed of nickel of 10-1000 nm in thickness. The third layer 603 may be formed of gold of 0.1-3.0 μm in thickness. The fourth layer 604 may be formed of titanium of 5-100 nm in thickness.

Because the semiconductor having an opposed conductive type is made close to the two-dimensional carrier gas channel 310, the band structure is locally modified, thereby raising its threshold voltage. AlGaN/GaN structures otherwise have negative values in threshold voltage and are thus in a normally-on state in general. The aforementioned structure causes such rise in threshold voltage and thus locally changes a part of the channel 310 under the structure into a normally-off state. This leads to safer operation because current does not flow until positive bias is applied.

Substantially the same sectional structure is applied to the channel modifier 62, which is also formed on the second active layer 32, preferably on a recess 324, and the channel modifier 62 is isolated from any electrodes 41, 42 and 61. Thus the channel modifier 62 locally changes a part of the channel 310 under the channel modifier 62 into a normally-off state. As the first electrode 61 and the channel modifier 62 have a common sectional structure, they can be produced by a common process.

An insulator layer 5 may be formed on the second active layer 32 and the electrodes 41 and 42. Silicon oxide, silicon nitride, a complex thereof, or any proper material may be applied thereto.

FIG. 2 illustrates an exemplary arrangement of the electrodes and the channel modifier in a plan view. The second electrodes 41 and 42 are formed in comb-like shapes, in which bonding pads 41P and 42P correspond to the handles or shanks and teeth portions extending therefrom are coupled together via the bonding pads 41P and 42P. The bonding pads 41P and 42P may be used for electric connection with the exterior. The electrodes 41 and 42 are opposed to each other in a way where the teeth portions 41 run in a Y direction and the teeth portions 42 run opposed thereto for example, and are as well mutually isolated but sufficiently close to each other.

The second electrodes 41 and 42 leave a meandering gap therebetween. The first electrode 61 runs along this meandering gap so as not to have electric contact with any of the second electrodes 41 and 42. The first electrode 61 may have a short cut intersecting any of the electrodes 41 and 42 for the purpose of assuring unity of potential. Even in this case, isolation is assured by means of the insulator layer 5 interposed therebetween. One or more bonding pads 61P may be provided for the first electrodes 61.

Enclosing but being isolated from these electrodes 41, 42 and 61, the channel modifier 62 is formed. The channel modifier 62 is so formed as to enclose the electrodes 41, 42 and 61, and is preferably a closed loop in view of better prevention of leak current therefrom but may be a non-closed loop having a gap. The channel modifier 62 may be also comprised of a bonding pad 62P, but electric connection with the exterior is not necessarily required. The channel modifier 62 may be connected with the substrate 2, which is in general grounded, for the purpose of stabilizing its potential. Alternatively, any voltage may be intentionally applied to the channel modifier 62.

The two-dimensional carrier gas channel 310 is formed in the first active layer 31 along the hetero junction as described above and ranges all over the device 1 except the parts below the first electrode 61 and the channel modifier 62. This will be briefly described hereinafter with reference to FIGS. 4 and 5. In these drawings, the reference signs Ef, Ec and Ev respectively denote a Fermi level, a lower limit of a conductance band and an upper limit of a valence band.

Figure 4:
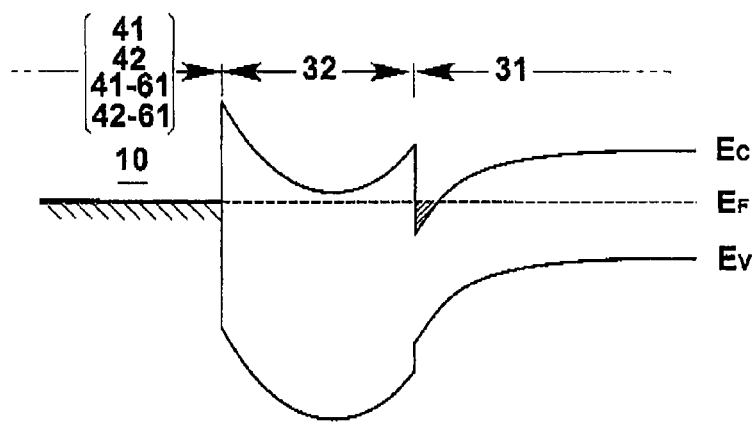
FIG. 4 shows a band structure in a hetero junction included in the compound semiconductor device.

The first active layer 31 of GaN has a band gap of about 3.5V and the second active layer 32 of AlGaN has a band gap of about 3.8-4.6V. There exists energy discontinuity about 0.2V between AlGaN and GaN at the hetero junction and on the other hand the band structure near the hetero junction gets distorted so as to make Fermi levels of them even, as shown in FIG. 4. As a result, the lower limit Ec of the conduction band comes below the Fermi level just close to the hetero junction in the first active layer 31, so a quantum well is formed here in a triangular shape. Strong polarization induced by the spontaneous polarization along with piezo polarization generates dense two-dimensional electron gas in the quantum well. Thus the two-dimensional carrier gas channel 310 is generated.

Figure 5:
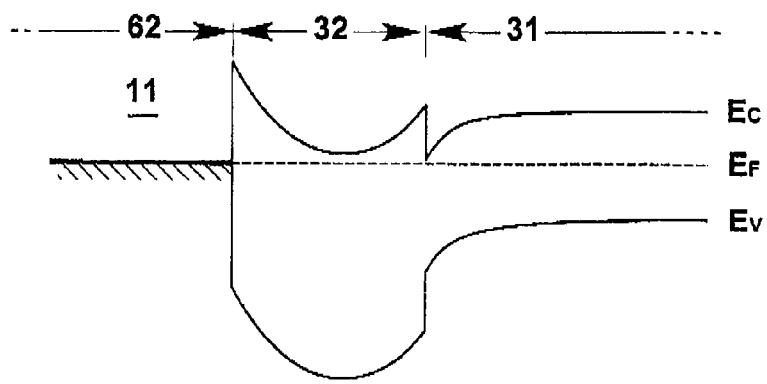
FIG. 5 shows a band structure modified by the channel modifier.

Referring to FIG. 5, the part under the channel modifier 62 presents a somewhat different aspect. As the second active layer 32 is made thinner, both the spontaneous polarization and the piezo polarization are made weak, so abundant electrons are not supplied to the bottom of the conduction band. Further the semiconductor layer 601 made close to the hetero junction, which is of a conductive type different from that of the two-dimensional carrier gas channel 310, distorts the band structure upward, so the bottom of the conduction band is held above the Fermi level. Thus this part cannot locally function as a conductive channel, namely being changed into a normally-off state.

The normally-off state is not influence by how the device 1 operates and is thus steadily in a normally-off state. More specifically, the channel modifier 62 enclosing the device region 10 efficiently prevent current leakage out of or into the device region 10.

In the meantime, the same mechanism acts on the part under the first electrode 61, so this part is also changed into a normally-off state, thereby assuring safer operation.

Figure 6:
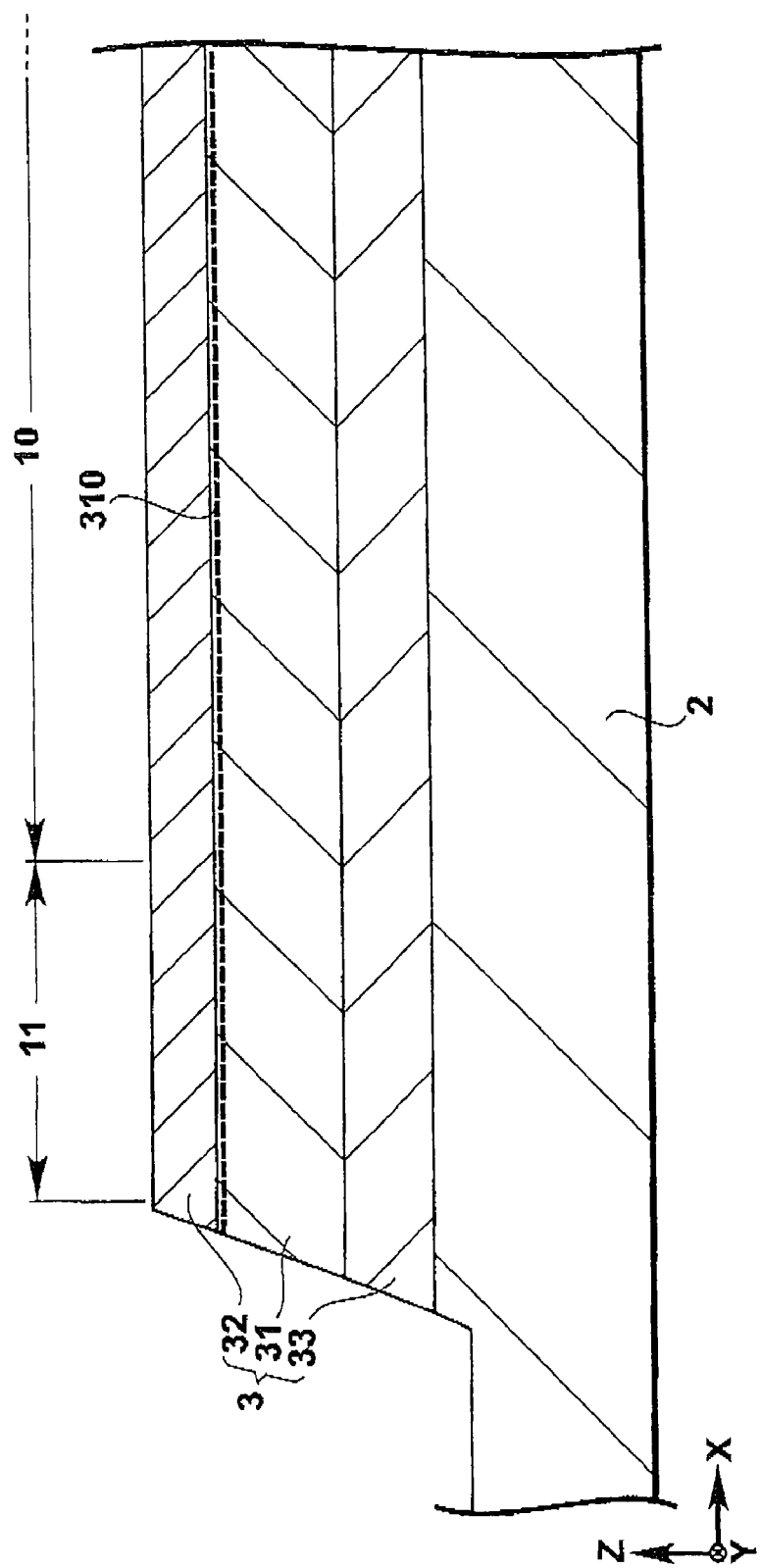
FIG. 6 is a schematic sectional view of the compound semiconductor device in a production process just after forming a hetero junction.

A production process will be exemplarily described hereinafter with reference to FIGS. 6 and 7.

First a known epitaxial growth method such as MOCVD (Metalorganic Chemical Vapor Deposition) is carried out to form the compound semiconductor layer 3 on the substrate 2, which is made of a single crystal of silicon for example. In this step, the buffer layer 33 if necessary, the first active layer 31 of GaN for example, and the second active layer 32 of AlGaN for example are layered step by step. Mesa etching may be thereafter carried out to shape the layer 3 into a form of a plateau or mesa as shown in FIG. 6.

Figure 7:
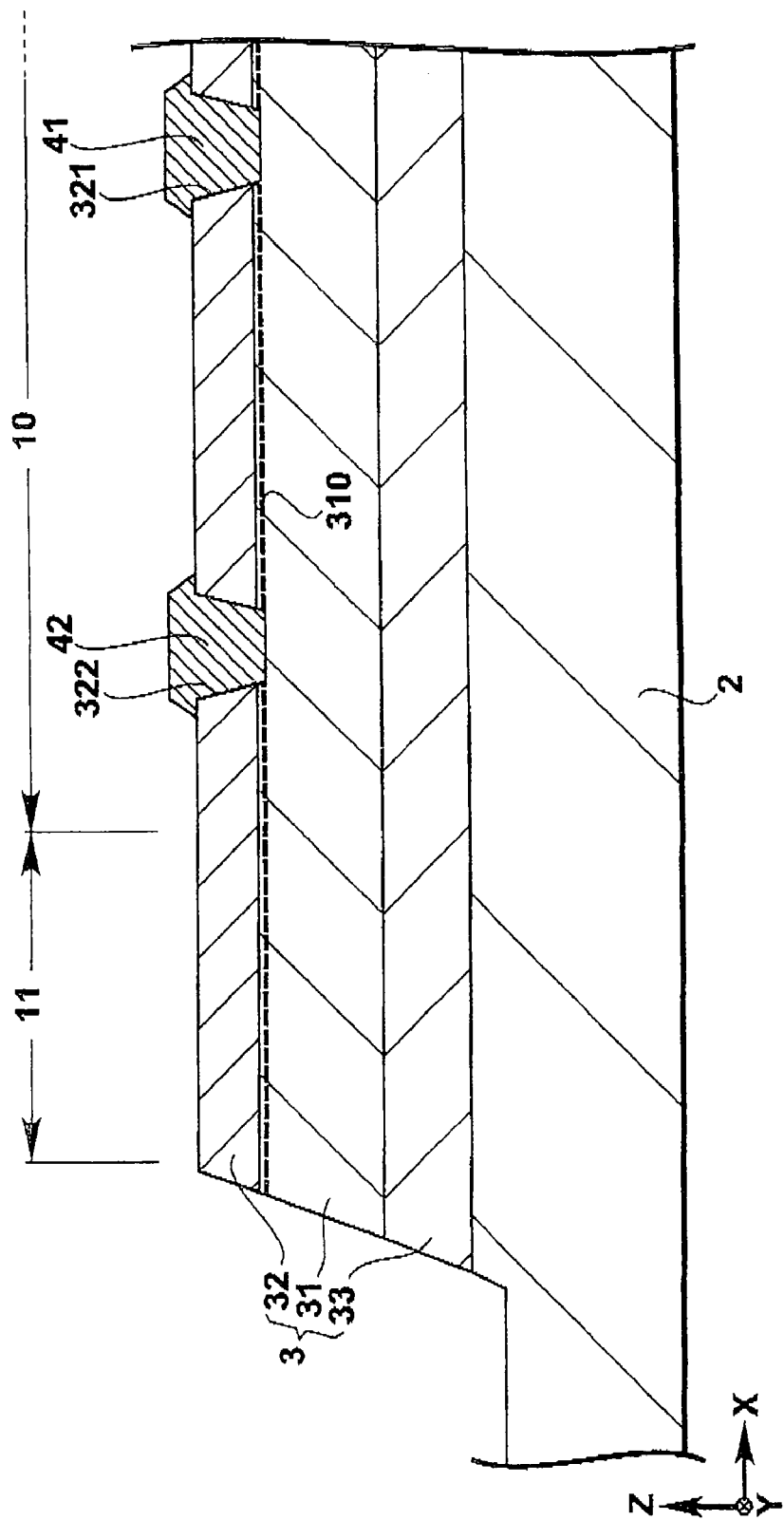
FIG. 7 is a schematic sectional view of the compound semiconductor device in the production process just after forming a source electrode and a drain electrode.

Next, dry etching is carried out to form through-holes or via-holes 321 and 322 penetrating the second active layer 32, or preferably slightly sinking down into the first active layer 31, and then metal deposition is carried out to fill the holes 321 and 322 with any metal such as titanium, gold or a multilayer thereof, thereby forming the second electrodes 41 and 42 as shown in FIG. 7. As an identical layer structure can be applied to the electrodes 41 and 42 as described above, formation of the electrodes 41 and 42 can be done at once.

Next any proper deposition such as plasma CVD is carried out to thoroughly cover the upper most surface with the insulator layer 5 of a proper insulator material such as silicon oxide, silicon nitride, or a complex thereof. Dry etching is again carried out to remove the insulator layer 5 in part and then expose predetermined sites of the second active layer 32, or preferably form the recesses 323 and 324 which recede in the second active layer 32 toward the first active layer 31 but does not reach the first active layer 31. In some situations, this etching step may be omitted.

Any proper deposition method such as sputtering or electron beam (EB) is carried out to form the first electrode 61 and the channel modifier 62 on the exposed sites of the second active layer 32 or in the recesses 323 and 324 if provided. The first electrode 61 and the channel modifier 62 include p-type semiconductor such as properly doped iron oxide, cobalt oxide, manganous oxide, cuprous oxide, AlGaN, GaN or InGaN. As an identical layer structure can be applied to the first electrode 61 and the channel modifier 62 as described above, formation of the first electrode 61 and the channel modifier 62 can be done at once. Then the compound semiconductor device 1 as shown in FIG. 1 is produced.

The compound semiconductor device 1 is advantageous in suppression of leak current and also productivity because the peripheral region enclosing the device region kills current leak paths and can be formed by a common step with formation of the first (gate) electrode.

(Second Embodiment)

Figure 8:
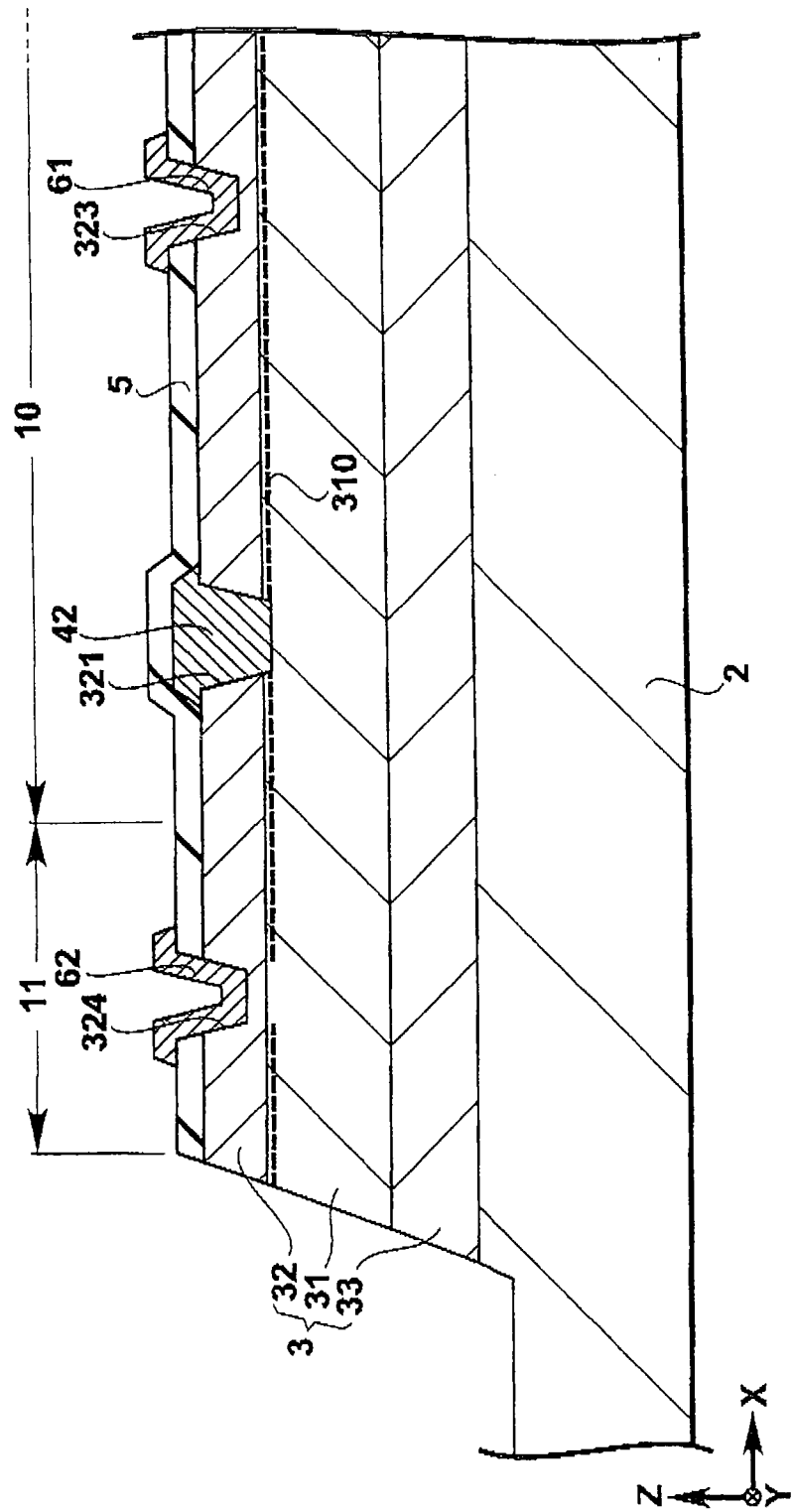
FIG. 8 is a schematic sectional view of a compound semiconductor device according to a second embodiment of the present invention.

The same inventive concept is further applicable to a Schottky barrier diode (SBD) as exemplarily illustrated in FIG. 8.

A compound semiconductor device 1 shown in FIG. 8 is comprised of a compound semiconductor layer 3 including a first active layer 31 and a second active layer 32, which form a hetero junction; a first electrode 61 formed on the second active layer 32; a second electrode 42 in contact with the first active layer 31; and a channel modifier 62 formed on the second active layer 32. The electrodes 42 and 61 are formed in a device region 10 and the channel modifier 62 is formed in a peripheral region 11 enclosing the device region 10.

As with the first embodiment, the hetero junction between the first active layer 31 and the second active layer 32 generates a two-dimensional carrier gas 310, and the second electrode 42 is in ohmic contact with the two-dimensional carrier gas channel 310.

Although FIG. 8 exemplarily shows that the device 1 includes a recess 323 for the first electrode 61, the recess 323 can be omitted and instead the first electrode 61 may be formed simply on the second active layer 32. The first electrode 61 is so formed as to form a Schottky contact with the second active layer 32 by using a proper material such as nickel, gold, titanium, ruthenium or aluminum.

When the first electrode 61 and the second electrode 42 are respectively used as a cathode and an anode, the device 1 functions as a diode.

The channel modifier 62 structured in the same way as the first embodiment is isolated from, but encloses, the electrodes 42 and 61. As with the first embodiment, the channel modifier 62 kills current leak paths. The second embodiment serves the same or similar effects as those of the first embodiment.

(Third Embodiment)

Figure 9:
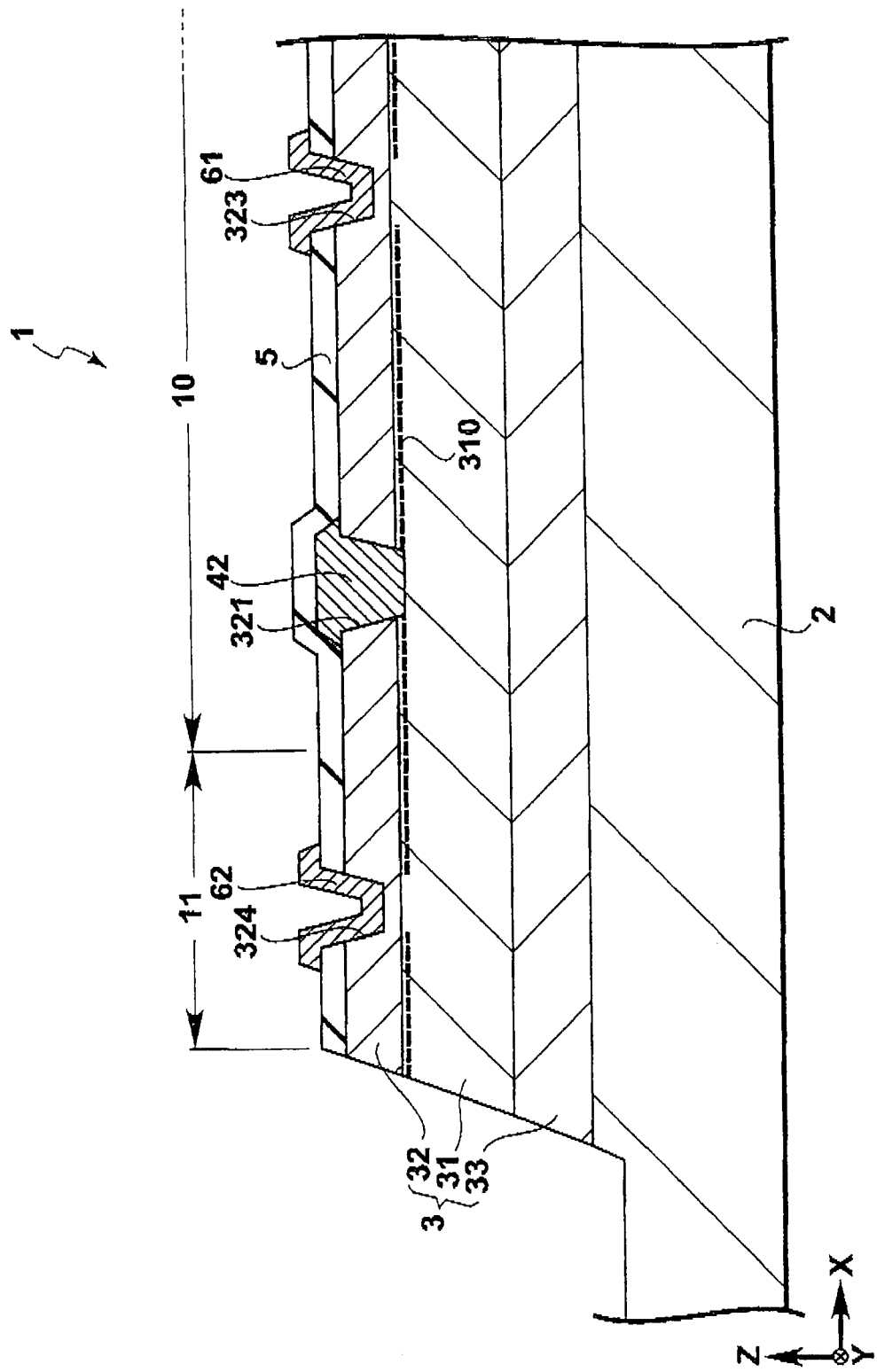
FIG. 9 is a schematic sectional view of a compound semiconductor device according to a third embodiment of the present invention.

Referring to FIG. 9, the first electrode 61 in the aforementioned second embodiment can be modified so as to include a semiconductor layer having a conductive type different from that of the two-dimensional carrier gas channel 310, as with the first embodiment. The first electrode 61 thus structured can be produced by a common process with the carrier modifier 62.

The third embodiment serves the same or similar effects as those of the first end second embodiments.

(Fourth Embodiment)

Figure 10:
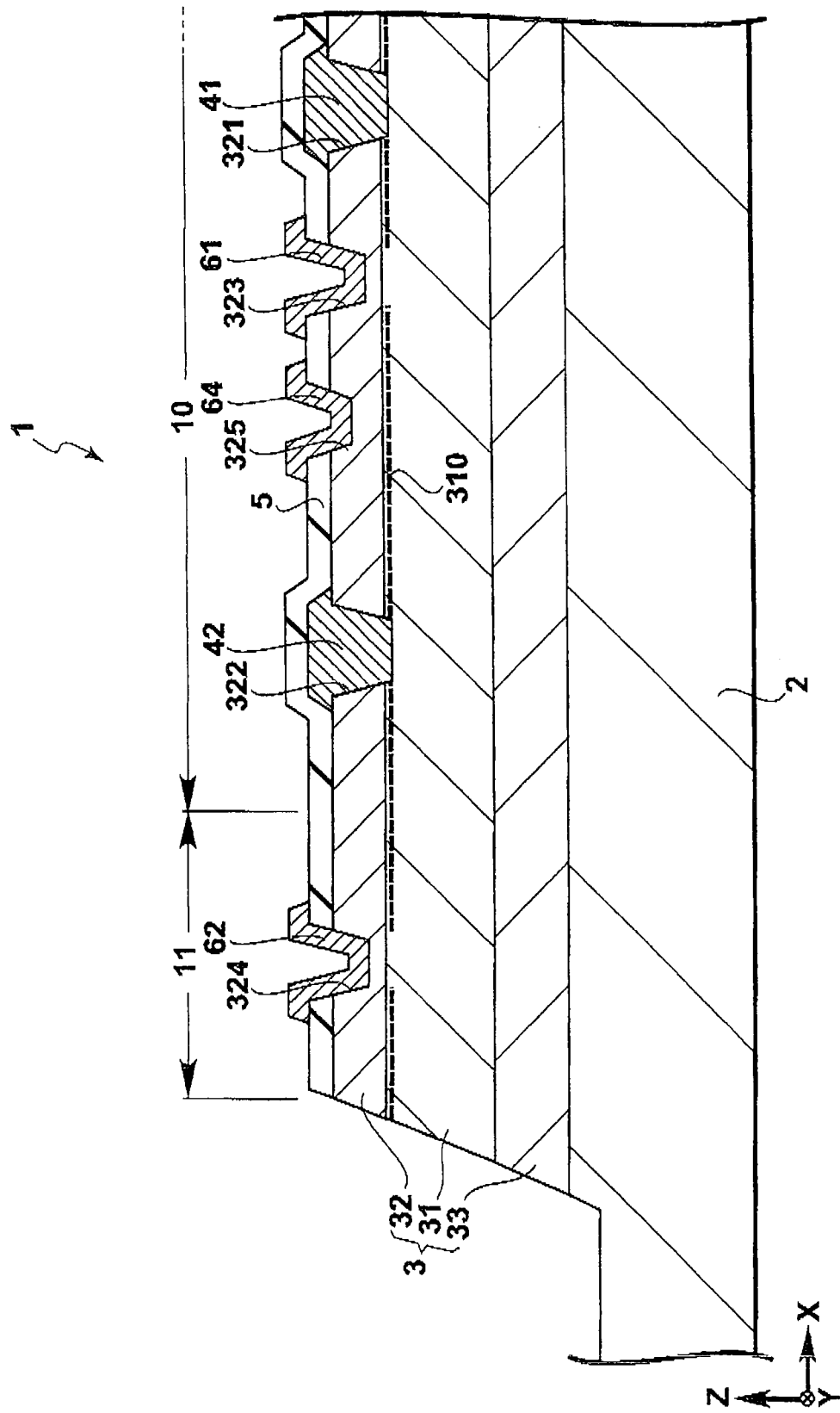
FIG. 10 is a schematic sectional view of a compound semiconductor device according to a fourth embodiment of the present invention.

A HEMT device like the first embodiment and a SBD device like the second or third embodiment can be hybridized in a single device 1 in a way as shown in FIG. 10.

In addition to the device 1 of the first embodiment, the device 1 of the fourth embodiment further includes a third electrode 64, which is formed in a recess 325 similar to or shallower than the recess 323 for the first electrode 61. The third electrode 64 is electrically connected with one of the second electrode 41 although not shown in the sectional view.

The third electrode 64 functions as an anode of the SBD and the second electrode 42 functions as a cathode of the SBD as well as a drain of the HEMT. Thus the diode is so connected as to absorb a carrier in a reverse direction in the HEMT, namely from the second electrode 42 through the part just below the first electrode 61 to the second electrode 41. More specifically, the device 1 functions as the HEMT with the built-in diode serving as a feedback diode, a regenerative diode or a protection diode. This is advantageous in improvement of breakdown voltage in a reverse direction.

The third electrode 64 thus structured can be, but not necessarily, produced by a common process with the carrier modifier 62.

The fourth embodiment serves the same or similar effects as those of the first through third embodiments.

(Fifth Embodiment)

Figure 11:
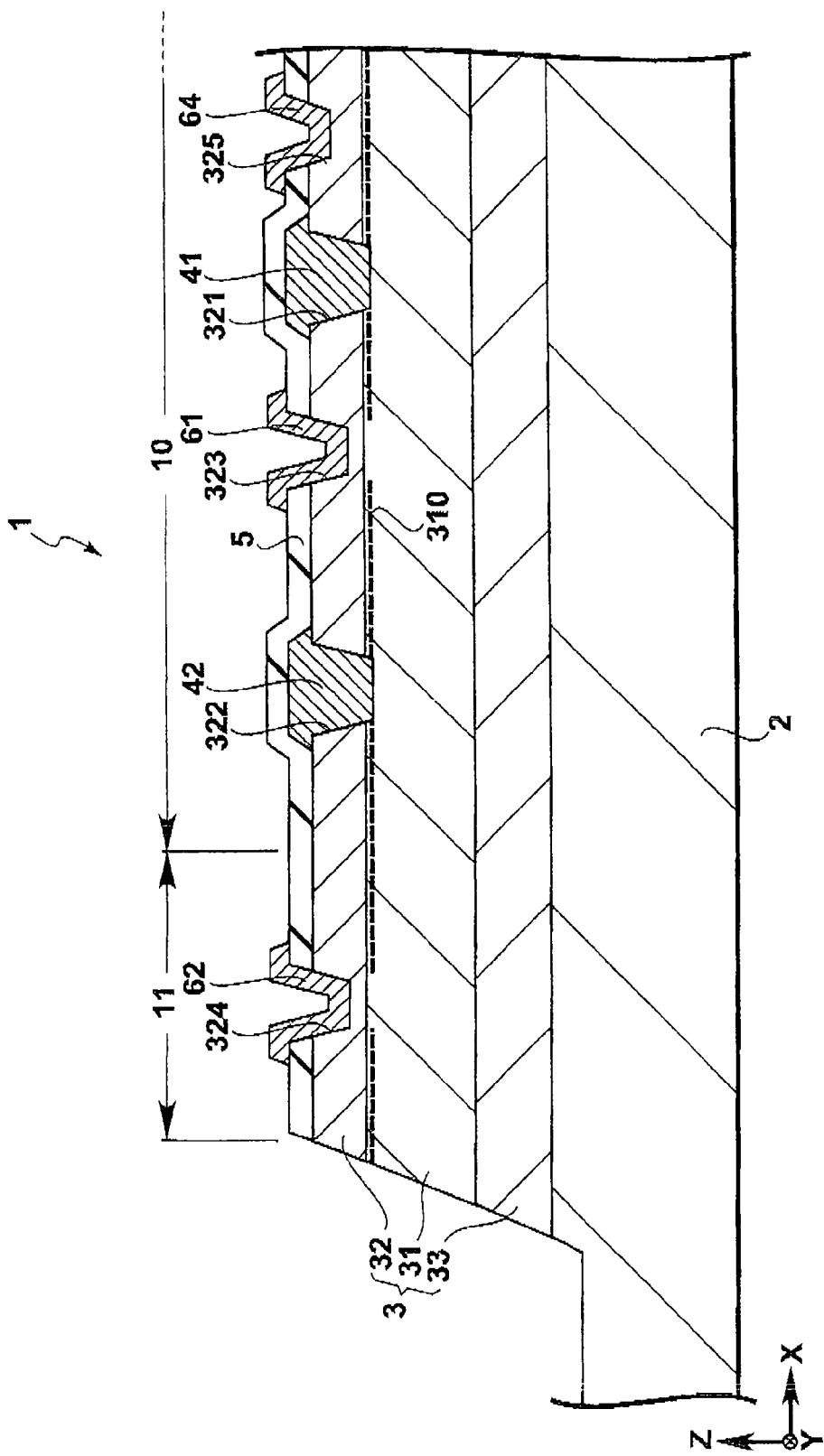
FIG. 11 is a schematic sectional view of a compound semiconductor device according to a fifth embodiment of the present invention.

Arrangement of the third electrode 64 can be modified in a way as shown in FIG. 11, where the anode 64 is disposed away from the drain 41.

The fifth embodiment serves the same or similar effects as those of the first through fourth embodiments.

Throughout the disclosed embodiments, either or both of the first electrode 61 and the channel modifier 62 may be comprised of a Schottky contact instead of a semiconductor layer of a conductive type different from that of the two-dimensional carrier gas channel 310.

Although the invention has been described above by reference to certain embodiments of the invention, the invention is not limited to the embodiments described above. Modifications and variations of the embodiments described above will occur to those skilled in the art, in light of the above teachings.

What is claimed is:

1. A compound semiconductor device comprising:
   a compound semiconductor layer including a first active layer and a second active layer forming a hetero junction with the first active layer so as to generate a two-dimensional carrier gas channel in the first active layer along the hetero junction;
   a first electrode formed on the second active layer;
   a second electrode in ohmic contact with the first active layer and isolated from the first electrode; and
   a channel modifier for locally changing a part of the first active layer under the channel modifier into a normally-off state, the channel modifier being formed on the second active layer so as to enclose but be isolated from the first electrode and the second electrode.

2. The compound semiconductor device of claim 1, wherein the second active layer comprises a first recess receding toward but not reaching the first active layer and the first electrode is formed in the first recess.

3. The compound semiconductor device of claim 1, wherein the second active layer comprises a second recess enclosing but being isolated from the first electrode and receding toward but not reaching the first active layer, and the channel modifier is formed in the second recess.

4. The compound semiconductor device of claim 1, wherein the two-dimensional carrier gas channel has a first conductive type and the channel modifier comprises a semiconductor layer of a second conductive type different from the first conductive type.

5. The compound semiconductor device of claim 4, wherein the semiconductor layer comprises one selected from the group consisting of a metal oxide semiconductor and a second compound semiconductor.

6. The compound semiconductor device of claim 1, further comprising:
   an insulator layer interposed between the channel modifier and the compound semiconductor layer.

7. The compound semiconductor device of claim 1, further comprising:
   a third electrode in ohmic contact with the first active layer and isolated from the first electrode and the second electrode.

8. The compound semiconductor device of claim 7, further comprising:
   a fourth electrode formed on the second active layer, whereby the fourth electrode and one selected from the group of the second electrode and the third electrode functions as a Schottky diode.

9. A method of production of a compound semiconductor device, comprising:
   forming a first active layer of a first compound semiconductor;
   forming a hetero junction by layering a second active layer on the first active layer so as to naturally generate a two-dimensional carrier gas channel in the first active layer along the hetero junction;

forming a second electrode on the first active layer so as to have an ohmic contact with the first active layer and isolate the second electrode from a first electrode; and forming the first electrode and a channel modifier for locally changing a part of the first active layer under the channel modifier into a normally-off state on the second active layer so that the second electrode is isolated from the first electrode and the channel modifier encloses but is isolated from the first electrode and the second electrode.

* * * * *